(12) United States Patent
Chen

(10) Patent No.: US 6,359,486 B1
(45) Date of Patent: *Mar. 19, 2002

(54) MODIFIED PHASE INTERPOLATOR AND METHOD TO USE SAME IN HIGH-SPEED, LOW POWER APPLICATIONS

(75) Inventor: Dao-Long Chen, Fort Collins, CO (US)

(73) Assignee: LSI Logic Corporation, Milpitas, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/575,585

(22) Filed: May 22, 2000

(51) Int. Cl.[7] ............................................. H03K 11/16
(52) U.S. Cl. ..................... 327/231; 327/233; 327/235; 327/246; 327/356; 327/119
(58) Field of Search ................................. 327/231, 232, 327/233, 234, 235, 237, 246, 247, 356, 359, 119, 120, 121

(56) References Cited

U.S. PATENT DOCUMENTS

| | | | | |
|---|---|---|---|---|
| 5,122,687 A | * | 6/1992 | Schmidt | 327/359 |
| 5,151,624 A | * | 9/1992 | Stegherr et al. | 327/356 |
| 5,708,383 A | * | 1/1998 | Lee | 327/359 |
| 5,889,425 A | * | 3/1999 | Kimura | 327/359 |
| 6,125,272 A | * | 9/2000 | Bautista et al. | 327/359 |
| 6,194,947 B1 | * | 2/2001 | Lee et al. | 327/359 |

\* cited by examiner

Primary Examiner—Terry D. Cunningham
Assistant Examiner—An T. Luu
(74) Attorney, Agent, or Firm—Trexler, Bushnell, Giangiorgi, Blackstone & Marr Ltd.

(57) ABSTRACT

A phase interpolator that receives input clock phase and selection inputs that are distinct from the input clock phases. The phase interpolator generates an output clock phase based on the selection inputs. The phase interpolator includes selector devices which receive the input clock phases and receive the selection inputs, and includes cross-coupled switches which are connected to the selector devices and receive input clock phases therefrom. The selector devices select which input clock phases to provide to the cross-coupled switches based upon the selection inputs. The cross-coupled switches generate the output clock phase based upon the input clock phases which are received from the selector devices.

3 Claims, 8 Drawing Sheets

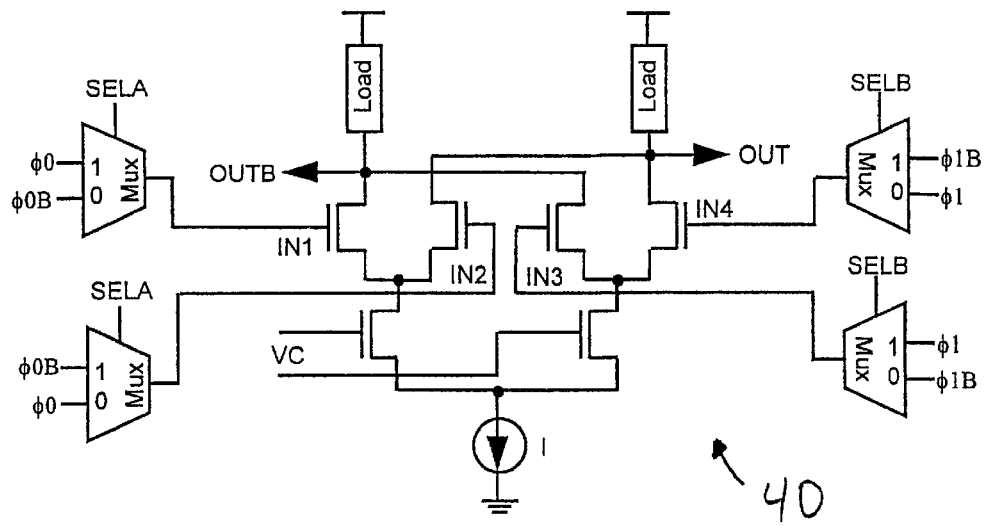
FIG. 7
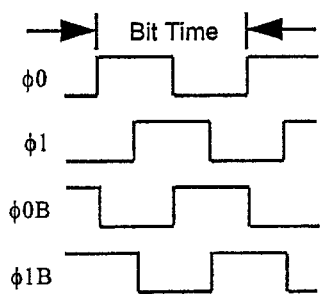
FIG. 8
| SELA | SELB | IN1 | IN2 | IN3 | IN4 | Output Phase |
|------|------|-----|-----|-----|-----|--------------|
| 1 | 1 | φ0 | φ0B | φ1 | φ1B | 0° < θ < 90° |
| 0 | 1 | φ0B | φ0 | φ1 | φ1B | 90° < θ < 180° |
| 0 | 0 | φ0B | φ0 | φ1B | φ1 | 180° < θ < 270° |
| 1 | 0 | φ0 | φ0B | φ1B | φ1 | 270° < θ < 360° |
FIG. 9

| SELA | SELB | SELC | SELD | AIN1 | AIN2 | AIN3 | AIN4 | AOUT Phase |
|---|---|---|---|---|---|---|---|---|
| 1 | 1 | 1 | 1 | φ0 | φ0B | φ1 | φ1B | 0° < θ < 45° |
| 0 | 1 | 1 | 1 | φ2 | φ2B | φ1 | φ1B | 45° < θ < 90° |
| 0 | 0 | 1 | 1 | φ2 | φ2B | φ3 | φ3B | 90° < θ < 135° |
| 1 | 0 | 0 | 1 | φ0B | φ0 | φ3 | φ3B | 135° < θ < 180° |
| 1 | 1 | 0 | 0 | φ0B | φ0 | φ1B | φ1 | 180° < θ < 225° |
| 0 | 1 | 0 | 0 | φ2B | φ2 | φ1B | φ1 | 225° < θ < 270° |
| 0 | 0 | 0 | 0 | φ2B | φ2 | φ3B | φ3 | 270° < θ < 315° |
| 1 | 0 | 1 | 0 | φ0 | φ0B | φ3B | φ3 | 315° < θ < 360° |

| SELA | SELB | SELC | SELD | BIN1 | BIN2 | BIN3 | BIN4 | BOUT Phase |
|---|---|---|---|---|---|---|---|---|
| 1 | 1 | 1 | 1 | φ2 | φ2B | φ3 | φ3B | 90° < θ < 135° |
| 0 | 1 | 1 | 1 | φ0B | φ0 | φ3 | φ3B | 135° < θ < 180° |
| 0 | 0 | 1 | 1 | φ0B | φ0 | φ1B | φ1 | 180° < θ < 225° |
| 1 | 0 | 0 | 1 | φ2B | φ2 | φ1B | φ1 | 225° < θ < 270° |
| 1 | 1 | 0 | 0 | φ2B | φ2 | φ3B | φ3 | 270° < θ < 315° |
| 0 | 1 | 0 | 0 | φ0 | φ0B | φ3B | φ3 | 315° < θ < 360° |
| 0 | 0 | 0 | 0 | φ0 | φ0B | φ1 | φ1B | 360° < θ < 45° |
| 1 | 0 | 1 | 0 | φ2 | φ2B | φ1 | φ1B | 45° < θ < 90° |

| SELA | SELB | SELC | SELD | AOUT Phase | BOUT Phase |
|------|------|------|------|------------|------------|
| 1 | 1 | 1 | 1 | 0° < θ < 45° | 90° < θ < 135° |
| 0 | 1 | 1 | 1 | 45° < θ < 90° | 135° < θ < 180° |
| 0 | 0 | 1 | 1 | 90° < θ < 135° | 180° < θ < 225° |
| 1 | 0 | 0 | 1 | 135° < θ < 180° | 225° < θ < 270° |
| 1 | 1 | 0 | 0 | 180° < θ < 225° | 270° < θ < 315° |
| 0 | 1 | 0 | 0 | 225° < θ < 270° | 315° < θ < 360° |
| 0 | 0 | 0 | 0 | 270° < θ < 315° | 360° < θ < 45° |
| 1 | 0 | 1 | 0 | 315° < θ < 360° | 45° < θ < 90° |

MODIFIED PHASE INTERPOLATOR AND METHOD TO USE SAME IN HIGH-SPEED, LOW POWER APPLICATIONS

The present invention relates generally to phase interpolators and methods of using, same in applications, and more specifically relates to a phase interpolator that includes cross-coupled switches which are configured to swap inputs. The present invention also specifically relates to a method of using a phase interpolator in high-speed, low power applications.

BACKGROUND OF THE INVENTION

In many applications, a clock recovery circuit is required to recover an embedded clock signal from an incoming data stream. The embedded clock signal which is extracted from the data stream is often referred to as the "recovered clock." FIG. 1 illustrates typical waveforms of incoming data and a "recovered clock".

Depending on the application, the clock recovery circuit can be implemented either as a phase-locked loop (PLL) or as delay-locked loop (DLL) (see, for example, Thomas H. Lee et al., "A 2.5 V CMOS delay-locked loop for an 18 Mbit, 500 Megabyte/s DRAM", IEEE Journal of Solid-State Circuits, vol. 29, no. 12, pp. 1491–1496, December 1994). While a PLL 10 is illustrated in FIG. 2, a DLL 20 is illustrated in FIG. 3. A key component in either implementation is a delay cell. Specifically, as illustrated in FIG. 2, in a PLL 10, several delay cells 12 are connected in a closed loop 14 to form a voltage-controlled oscillator (VCO) 16. The oscillation frequency is controlled by adjusting a control voltage that is sent to the delay cells 12. As illustrated in FIG. 3, in a DLL 20, the VCO 16 is replaced by a variable delay line (VDL) 22. The VDL 22 included in a DLL 20 is similar to a VCO 16 which is included in a PLL 10 except the delay cells 12 are not wrapped around (i.e., there is no feedback 14 from the output of the last delay cell to the input of the first delay cell — compare FIG. 3 to FIG. 2). Both the VCO 16 and VDL 22 present disadvantages. The main disadvantage of a VCO 16 is its sensitivity to noise. Specifically, due to its closed-loop topology (i.e. as a result of the feedback 14), any noise coupled into the VCO 16 will circulate around the loop 14 and, depending on the time constant of the PLL 10, could take a long time to diminish. A VDL 22 avoids this problem because the output of the last delay cell is not looped back. However, the VDL 22 presents a different disadvantage. Because the total adjustable delay range of a VDL 22 is finite, the DLL 20 must be designed to operate within the delay range of its VDL 22. Designing the DLL as such can be a relatively difficult task since the delay range of a VDL depends on many variables, such as temperature.

In recent years, designers have attempted to replace VCO's and VDL's with a phase interpolator (see, for example, Lee et al., id.). As shown in FIG. 4, a phase interpolator generates a new clock phase ("Out") which locates between two input clock phases ($\phi 0$ and $\phi 1$). A phase interpolator can be configured for analog control or digital control. A possible circuit implementation of a phase interpolator 30a with analog control is illustrated in FIG. 5, while a possible circuit implementation of a phase interpolator 30b with digital control is illustrated in FIG. 6. Unfortunately, phase interpolators which are used to replace VCO's and VDL's generally consume a lot of power and cannot be used in applications where the data rates are high.

Objects and Summary

It is an object of an embodiment of the present invention to provide a phase interpolator which can be used in applications where the data rates are high.

Another object of an embodiment of the present invention to provide a phase interpolator which does not consume a lot of power.

Briefly, and in accordance with at least one of the foregoing objects, an embodiment of the present invention provides a phase interpolator which includes cross-coupled switches and is configured to receive a plurality of input clock phases and generate a new output clock phase based on the input clock phases which are selected. The cross-coupled switches receive the input clock phases and are controlled by selection inputs to select which input clock phases are used to generate the new output clock phase.

The phase interpolator may be configured to receive four clock phases, but preferably is configured to receive eight clock phases. Preferably, the phase interpolator includes eight cross-coupled switches, such as two sets of four cross-coupled switches. Preferably, each set of switches is controlled by a different selection input. Hence, a first selection input controls one set of four cross-coupled switches, and second selection input controls the other set of four cross-coupled switches. Preferably, each pair of switches—wherein each pair includes a switch from each set—is configured to receive the same clock phase. Specifically, each pair may be configured to receive a given, pre-determined clock phase (if the phase interpolator is configured to receive four clock phases), or a selector device such as a multiplexer can be connected to each pair of switches such that a clock phase can be selected from a plurality of clock phases (such as where the phase interpolator is configured to receive eight clock phases). The phase interpolator may be configured for analog or digital control. In order to strobe data effectively, two phase interpolators may be provided, wherein each phase interpolator receives the same clock phases and is controlled by the same selection inputs.

BRIEF DESCRIPTION OF THE DRAWINGS

The present invention and the advantages thereof will become more apparent upon consideration of the following detailed description when taken in conjunction with the accompanying drawings of which:

FIG. 7 is a schematic diagram illustrating a phase interpolator with a 360-degree range;

FIG. 8 illustrates four waveforms ("$\phi 0$", "$\phi 1$", "$\phi 0B$" and "$\phi 1B$") corresponding to input clock phases of the phase interpolator illustrated in FIG. 7;

FIG. 9 is a signal chart which relates to the phase interpolator illustrated in FIG. 7;

DESCRIPTION

Figure 1:
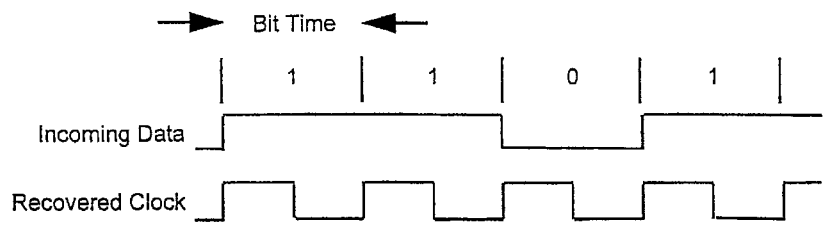
FIG. 1 illustrates two waveforms—one corresponding to incoming data and another corresponding to a recovered clock.
Figure 2:
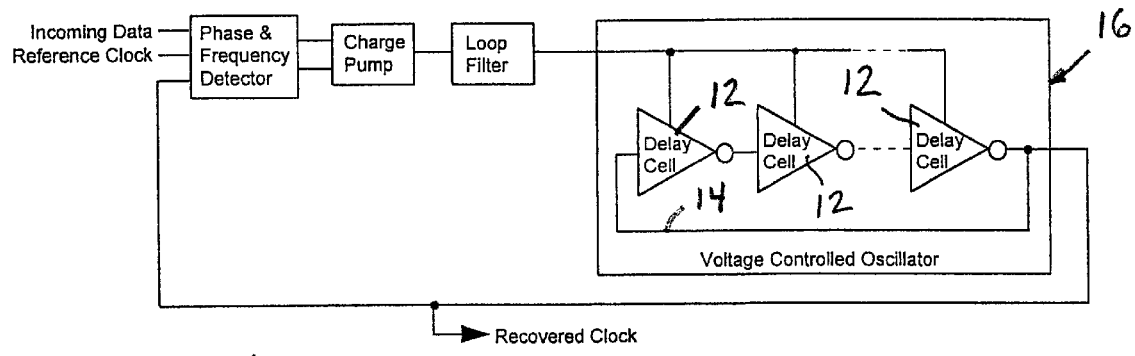
FIG. 2 is a schematic diagram illustrating a Phase-Locked Loop (PLL)
Figure 3:
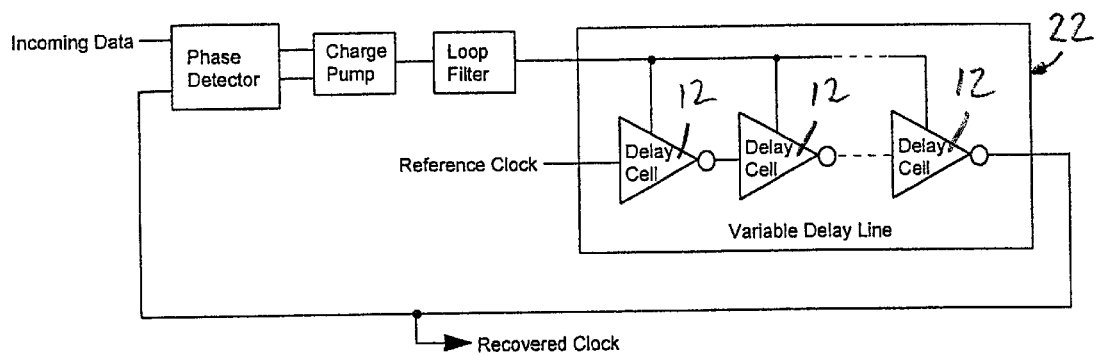
FIG. 3 is a schematic diagram illustrating a Delay-Locked Loop (DLL)

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

Figure 4:
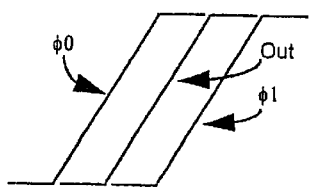
FIG. 4 is a schematic diagram illustrating a new output clock phase ("Out") which is located between two input clock phases ("$\phi 0$" and "$\phi 1$")
Figure 5:
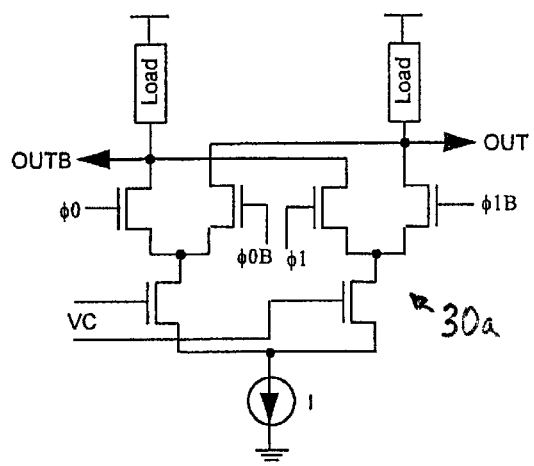
FIG. 5 is a schematic diagram illustrating a phase interpolator with analog control.

As discussed above, phase interpolators generates new clock phases between two input clock phases (see FIG. 4 and description above). Since the location of the new clock phase is adjustable, the phase interpolator can be used to replace a VDL. What makes it beneficial to use a phase interpolator as opposed to a VDL is the fact that, with a phase interpolator, an infinite delay range can be implemented. FIG. 7 illustrates a phase interpolator 40 with a 360-degree range. Specifically, the phase interpolator 40 has four clock phases, each 90 degrees apart. FIG. 8 illustrates the four clock phases—"φ0", "φ1", "φ0B" and "φ1B". FIG. 9 provides a signal chart relating to the phase interpolator shown in FIG. 7, and the signal chart lists the possible values of input control signals or selection inputs "SELA" and "SELB", the values of internal signals "IN1", "IN2", "IN3" and "IN4", and the resulting output phase. By selecting which clock phase is fed to the phase interpolator, a new clock phase can be generated at any location, from 0 to 360 degrees. This is equivalent to an infinite delay range. It should be noted that the 360-degree coverage is independent of process, temperature and supply voltage variations.

In a PLL, the phase interpolator illustrated in FIG. 7 can be used in place of a VCO to eliminate the noise problem presented by the feedback loop (discussed hereinabove). However, the frequency difference between the local clock and the embedded clock in the incoming data must be relatively small. Unfortunately, the phase interpolator 40 must operate at the same frequency as the incoming data (e.g., 5 Ghz for 5 Gb/s). Moreover, operating the phase interpolator 40 at the wire speed consumes a lot of power, and this farther limits the application.

Figure 10:
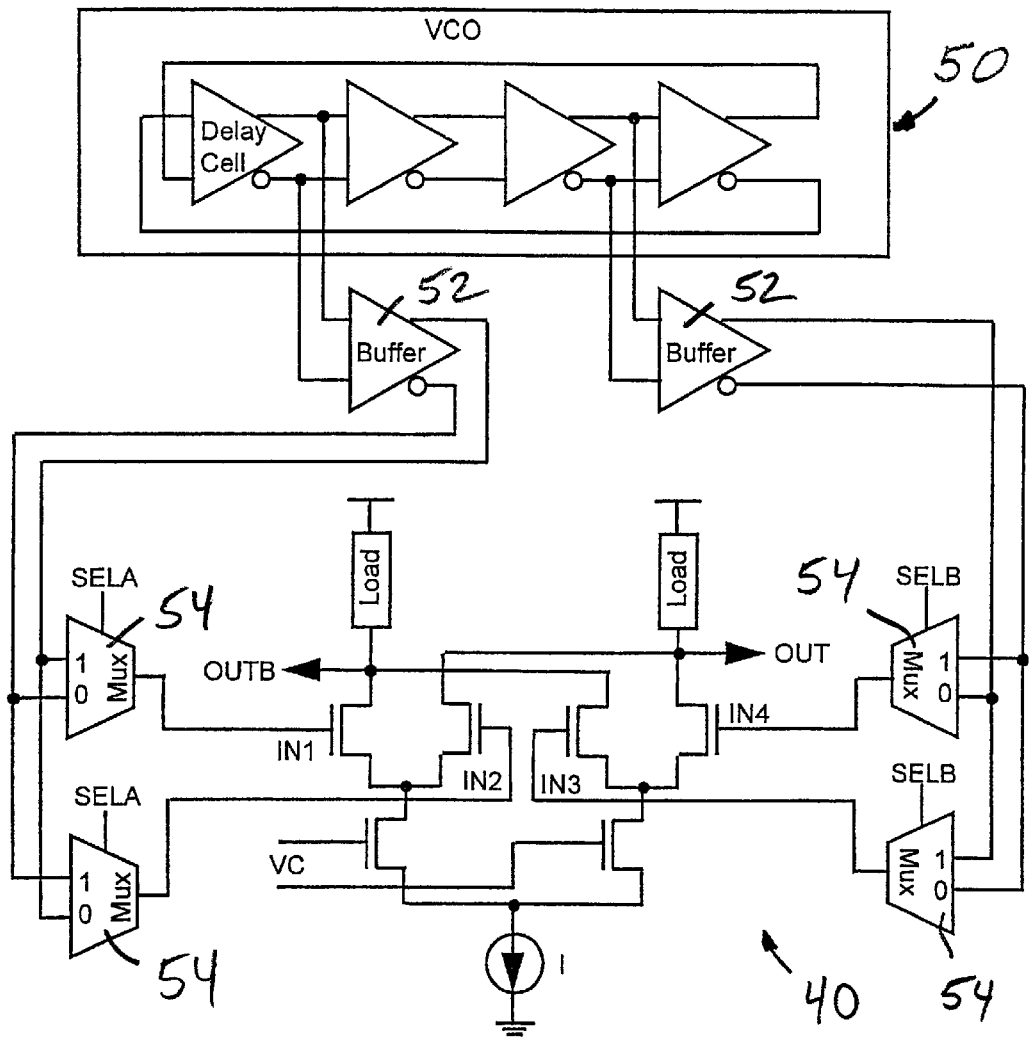
FIG. 10 is a schematic diagram showing the phase interpolator of FIG. 7 connected to a voltage controlled oscillator (VCO), wherein the VCO provides four input clock phases to the phase interpolator.

FIG. 10 illustrates the phase interpolator 40 of FIG. 7 connected to a VCO 50, thereby forming a test circuit. The VCO 50 generates the required 4-phase clocks (see FIG. 8) for the phase interpolator 40 (the VCO 50 actually generates eight clock phases, but only four are used in FIG. 10). As shown, buffers 52 and selector devices 54, such as multiplexers, are provided between the VCO 50 and phase interpolator 40. The clock phases are buffered first before being fed to the multiplexers 54 so that the speed of the VCO 50 will not be limited by the loading from the multiplexers 54. The phase interpolator 40 uses the two clock phases selected by the multiplexers 54 to generate the output clock phase ("OUT").

Transistor-level simulations showed that the phase interpolator 40, with all the supporting circuitry shown in FIG. 10, can only go up to 2.7 Ghz with a power dissipation of 22.7 mW (in a 0.18 μm CMOS process). Unfortunately, the circuit shown in FIG. 10 provides that the phase interpolator 40 is not as fast as desired, and consumes more power than is desirable.

Figure 11:
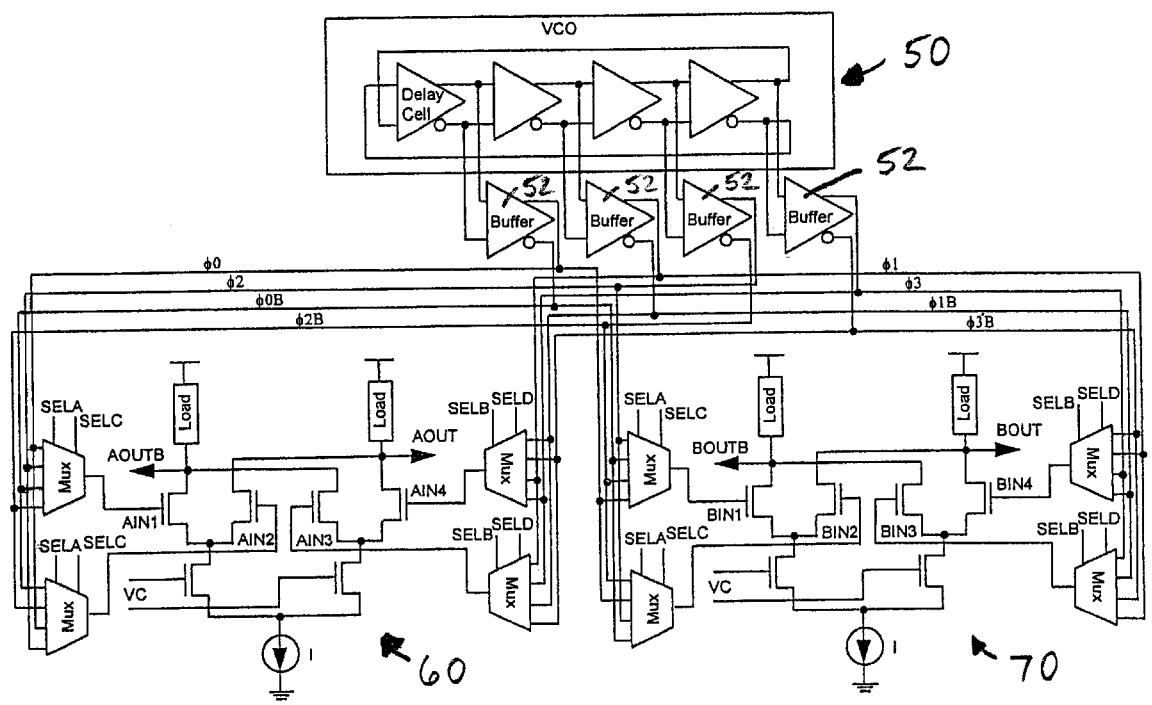
FIG. 11 is a schematic diagram showing a pair of phase interpolators connected to a VCO, wherein the VCO provides eight input clock phases to each of the phase interpolators.
Figures 12, 13, 14:
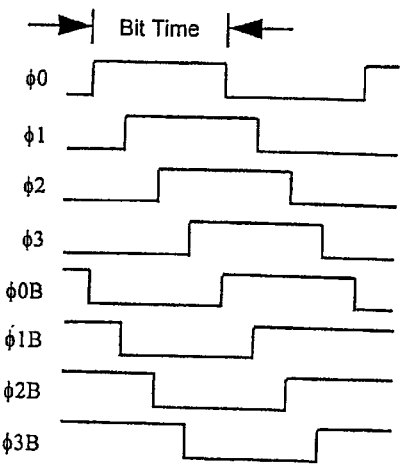
FIG. 12 illustrates eight waveforms ("φ0", "φ1", "φ2", "φ3", "φ0B", "1B", "φ2B", "φ3B"), each 45 degrees apart, corresponding to input clock phases of the phase interpolators illustrated in FIG. 11.
FIG. 13 is a signal chart which relates to the phase interpolator which is on the left in FIG. 1.
FIG. 14 is a signal chart which relates to the phase interpolator which is on the right in FIG. 11.

As shown in FIG. 11, instead of using only four clock phases from the VCO (see FIG. 10), it is possible to utilize all eight clock phases. FIG. 12 illustrates the eight clock phases—"φ0", "φ1", "φ2", "φ3", "φ0B", "φ1B", "φ2B" and "φ3B". This provides that the VCO 50 and phase interpolator can be operated at half of the data rate since each clock period now covers two bit times. In other words, for a 5 Gb/s system, the interpolator only has to operate at 2.5 Ghz. However, since a 180-degree out-of-phase signal (90-degree in this case since each clock period covers two bits) is needed to strobe the data, a second phase interpolator is required. FIG. 13 provides a signal chart relating to the phase interpolator 60 which is on the left in FIG. 11, and FIG. 14 provides a signal chart relating to the phase interpolator 70 which is on the right in FIG. 11. While this increases power consumption, the overall power is reduced as a result of operating at half speed. In FIG. 11, "AOUT" is the signal that is in phase with the data, and "BOUT" is 90 degrees out of phase and can be used to re-time the data.

Figure 6:
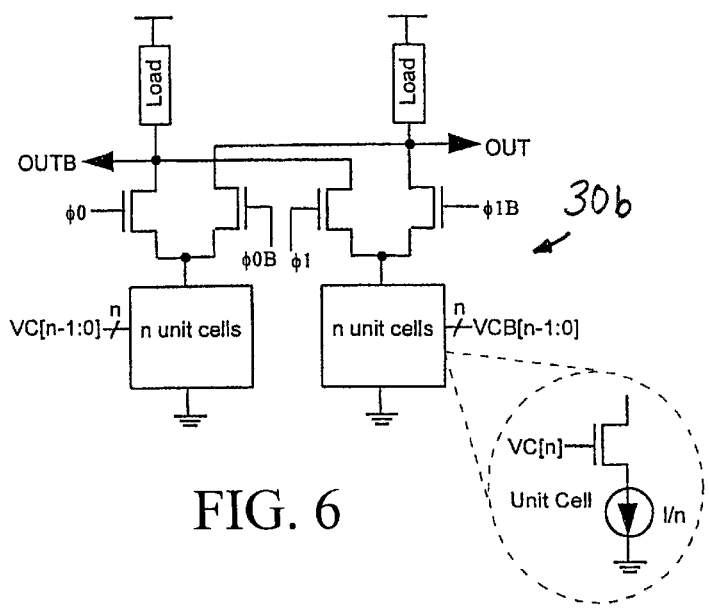
FIG. 6 is a schematic diagram illustrating a phase interpolator with digital control.
Figure 15:
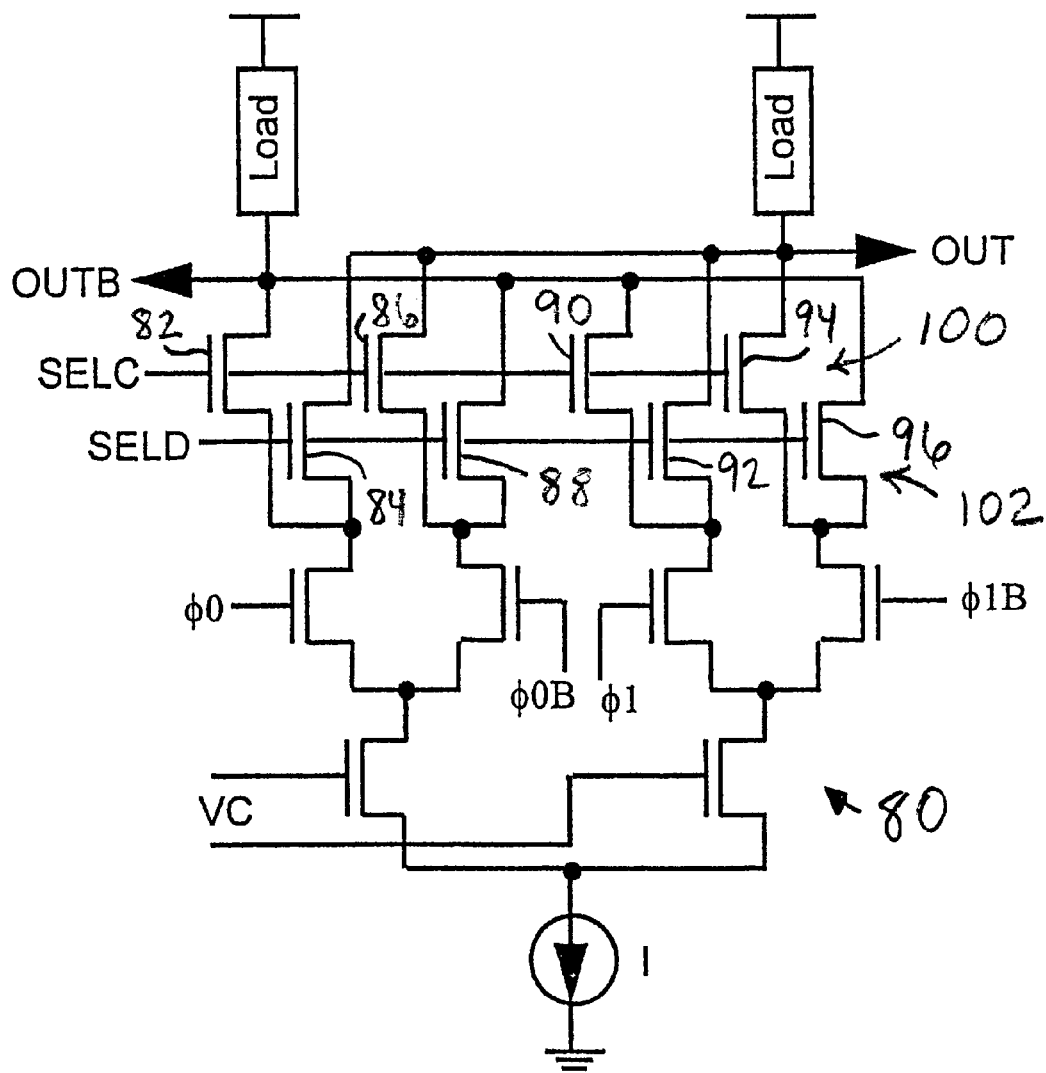
FIG. 15 is a schematic diagram showing a phase interpolator that includes eight cross-coupled switches.

As shown in FIG. 11, the loading at the outputs of the buffers 52 is twice what it was in FIG. 10. This will limit the maximum speed we can achieve since the buffers will have to be twice as big as they were before which, in turn, will increase the loading on the VCO 50. To overcome this loading problem, a phase interpolator 80 as illustrated in FIG. 15 can be provided. The phase interpolator 80 illustrated in FIG. 15 includes eight cross-coupled switches 82, 84, 86, 88, 90, 92, 94, 96. The purpose of the switches 82, 84, 86, 88, 90, 92, 94, 96 is to swap inputs when necessary. As shown, there are effectively two sets 100 and 102 of four cross-coupled switches, wherein each set of switches is controlled by a different selection input. A first selection input "SELC" controls a first set 100 of four cross-coupled switches 82, 86, 90, 94, and a second selection input "SELD" controls a second set 102 of four cross-coupled switches 84, 88, 92, 96. The cross-coupled switches 82, 84, 86, 88, 90, 92, 94, 96 receive the input clock phases ("φ0", "φ1", "φ0B" and "φ1B") and are controlled by the selection inputs ("SELC" and "SELD") to select which input clock phases are used by the phase interpolator to generate the output clock phase. As shown, each pair of switches—one from each set—is configured to receive the same input clock phase. Although VC is shown as an analog control signal in FIG. 15, it can also be a digital signal as shown in FIG. 6.

Figures 16, 17:
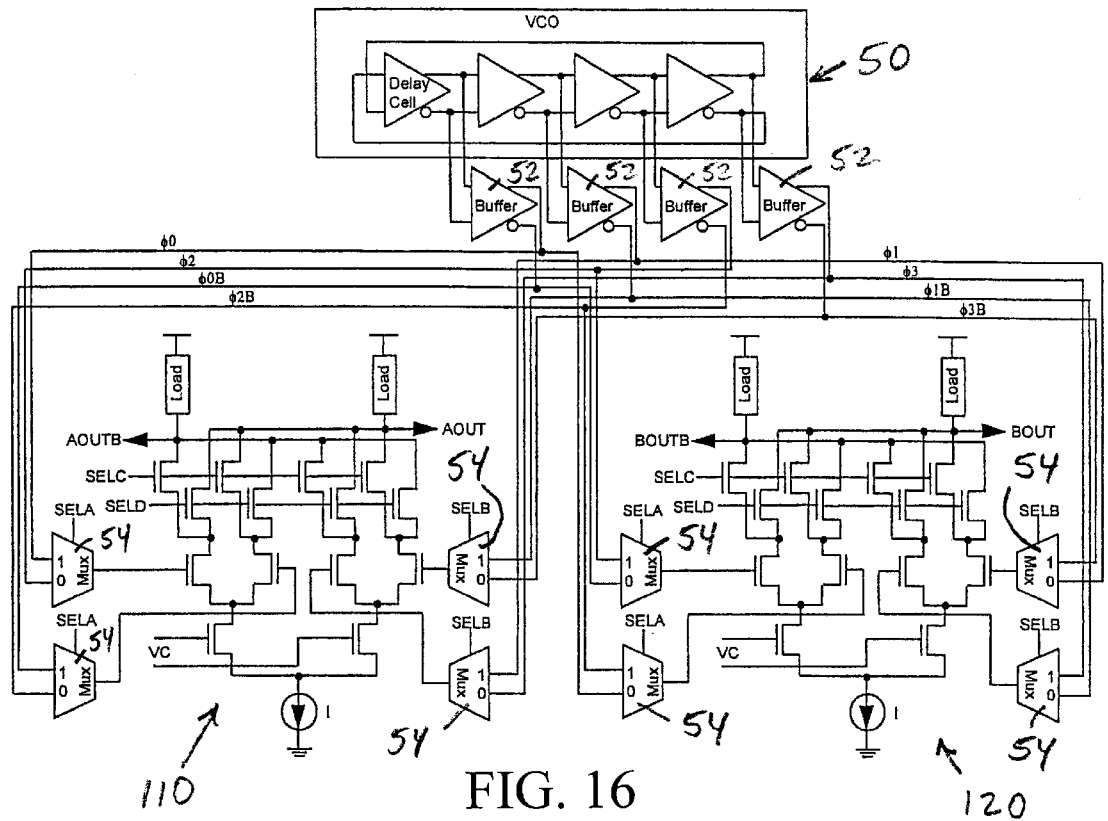
FIG. 16 is a schematic diagram showing a pair of phase interpolators connected to a VCO, wherein each phase interpolator is like that shown in FIG. 15, and wherein the VCO provides eight input clock phases to each of the phase interpolators.
FIG. 17 is a signal chart which relates to the phase interpolators shown in FIG. 16.

FIG. 16 illustrates how the phase interpolator 80 shown in FIG. 15 can be implemented into the circuit shown in FIG. 11. FIG. 17 provides a signal chart relating to the circuit shown in FIG. 16. Instead of totally counting on multiplexers to select the input clock phases (see FIGS. 7, 10 and 11), part of the selection is performed in the phase interpolators 1 10, 120, by the cross-coupled switches therein.

Consequently, the loading on buffers 52 is reduced by half. Selection inputs "SELA" and "SELB" control the multiplexers 54 in the circuit, and selection inputs "SELC" and "SELD" control the cross-coupled switches in the phase interpolators 110 and 120. As shown, "AOUT" and "BOUT" remain the same as shown in FIGS. 13 and 14. Despite having one more phase interpolator and two more buffers as compared to FIG. 10, transistor-level simulations of the circuit shown in FIG. 16 showed that, at a given data rate, the circuit in FIG. 16 consumes about half of the power consumed by the circuit in FIG. 10. Furthermore, its maximum data rate is twice what can be accomplished previously. Finally, it should be noted that the phase interpolator shown in FIG. 15 can be used in FIG. 10 to replace the phase interpolator and multiplexers shown in that FIGURE.

The phase interpolator 80 shown in FIG. 15, coupled with the clock phases running at half of the data rate, extends the maximum data rate by a factor of two for a given process technology. It also provides the following advantages over traditional approaches: For a given data rate, power consumption is reduced by half, better output linearity is achieved since the output phase is interpolated between two input clock phases that are 45 degrees apart instead of 90 degrees apart, and it is easier to share a single VCO among several phase interpolators (when many data channels are integrated into a single chip) since it is easier to distribute slower clocks.

While a embodiments of the present invention are shown and described, it is envisioned that those skilled in the art may devise various modifications of the present invention without departing from the spirit and scope of the appended claims.

What is claimed is:

1. A phase interpolator that receives input clock phases and selection inputs that are distinct form the input clock phases, and generates an output clock phase based on the selection inputs, said phase interpolator comprising: selector devices which receive the input clock phases and receive the selection inputs that are distinct from the input clock phases; and cross-coupled switches which are connected to the selector devices and receive input clock phases therefrom, wherein the selector devices are configured to select which input clock phases to provide to the cross-coupled switches based upon the selection inputs, wherein the cross-coupled switches are configured to generate the output clock phase based upon the input clock phases which are received from the selector devices, wherein said phase interpolator includes eight selector devices and eight cross-coupled switches connected to the eight selector devices, wherein each selector device receives a pair of selection inputs and four input clock phases, and wherein each selector device is configured to select a single input clock phase based on the selection inputs which are received.

2. A pair of phase interpolators connected to a voltage controlled oscillator, wherein each phase interpolator receives input clock phases and selection inputs that are distinct from the input clock phases, and generates an output clock phase based on the selection inputs, wherein each phase interpolator comprises: selector devices which receive the input clock phases and receive the selection inputs that are distinct from the input clock phases; and cross-coupled switches which are connected to the selector devices and receive input clock phases therefrom, wherein the selector devices are configured to select which input clock phases to provide to the cross-coupled switches based upon the selection inputs, wherein the cross-coupled switches are configured to generate the output clock phase based upon the input clock phases which are received from the selector devices, receives input clock phases from the voltage controlled oscillator and generates an output clock phase, wherein each phase interpreter receives the same input clock phases, wherein each phase interpolator includes eight selector devices and eight cross-coupled switches connected to the eight selector devices, wherein each selector device receives a pair of selection inputs and four input clock phases, and wherein each selector device is configured to select a single input clock phase based on the selection inputs which are received.

3. A phase interpolator that receives input clock phases and selection inputs that are distinct from the input clock phases, and generates an output clock phase based on the selection inputs, said phase interpolator comprising: a first selector device; a second selector device; a third selector device; a fourth selector device, said first and second selector devices configured to receive a first selection input, said third and fourth selector devices configured to receive a second selection input, said first selection input being distinct from said second selection input, said first and second selector devices configured to receive a first pair of input clock phases, said third and fourth selector devices configured to receive a second pair of input clock phases, said first pair of input clock phases being distinct from said second pair of input clock phases; and cross-coupled switches which are connected to the selector devices and receive input clock phases therefrom, wherein the selector devices are configured to select which input clock phases to provide to the cross-coupled switches based upon the selection inputs, wherein the cross-coupled switches are configured to generate the output clock phase based upon the input clock phases which are received from the selector devices.

* * * * *